(12) United States Patent
Takasaki et al.

(10) Patent No.: US 8,039,915 B2
(45) Date of Patent: Oct. 18, 2011

(54) SOLID-STATE IMAGE SENSOR

(75) Inventors: Kosuke Takasaki, Miyagi (JP); Mamoru Iesaka, Atsugi (JP); Hideki Wako, Toyohashi (JP)

(73) Assignee: FUJIFILM Corporation, Tokyo (JP)

( * ) Notice: Subject to any disclaimer, the term of this patent is extended or adjusted under 35 U.S.C. 154(b) by 187 days.

(21) Appl. No.: 12/442,884

(22) PCT Filed: Sep. 27, 2007

(86) PCT No.: PCT/JP2007/069399
§ 371 (c)(1),
(2), (4) Date: May 18, 2009

(87) PCT Pub. No.: WO2008/044580
PCT Pub. Date: Apr. 17, 2008

(65) Prior Publication Data
US 2010/0032784 A1 Feb. 11, 2010

(30) Foreign Application Priority Data
Sep. 28, 2006 (JP) .................. 2006-265497
Sep. 28, 2006 (JP) .................. 2006-265498

(51) Int. Cl.
*H01L 31/02* (2006.01)
(52) U.S. Cl. ........ 257/434; 257/432; 257/340; 257/433; 257/E31.11; 257/E21.001
(58) Field of Classification Search ........... 257/432–434
See application file for complete search history.

(56) References Cited

U.S. PATENT DOCUMENTS
5,480,715 A * 1/1996 Mills et al. .................. 428/327

2007/0007643 A1 1/2007 Oh et al.
2007/0194438 A1 8/2007 Takasaki et al.
2009/0246675 A1 * 10/2009 Nakamura et al. ....... 430/111.31
(Continued)

FOREIGN PATENT DOCUMENTS
CN 1542931 A 11/2004
(Continued)

OTHER PUBLICATIONS

International Preliminary Report on Patentability (Chapter I) with Written Opinion, mailed Apr. 9, 2009, issued in corresponding International Application No. PCT/JP2007/069399, 7 pages.

(Continued)

*Primary Examiner* — N Drew Richards
*Assistant Examiner* — Mamadou Diallo
(74) *Attorney, Agent, or Firm* — Sughrue Mion, PLLC

(57) ABSTRACT

A solid-state image sensor (1) includes: an imaging device wafer (2A); a plurality of imaging devices (3) which are formed on the imaging device wafer (2A); a spacer (5) which surrounds the imaging devices (3) on the imaging device wafer (2A) and is joined to the imaging device wafer (2A) with an adhesive (7); a transparent protection member (4) which covers the imaging devices (3) on the imaging device wafer (2A) and is attached on the spacer (5); and a plurality of electrostatic discharge protection devices (10A) which are formed on the imaging device wafer (2A), the electrostatic discharge protection devices (10A) being positioned under the spacer (5), each of the electrostatic discharge protection devices (10A) having diffusion layers (12, 13) and a well layer (11) between the diffusion layers (12, 13), the well layer (11) being provided with a channel stopper (20).

2 Claims, 7 Drawing Sheets

U.S. PATENT DOCUMENTS

2009/0285533 A1 * 11/2009 Hiroi et al. ..................... 385/65

FOREIGN PATENT DOCUMENTS

| EP | 1735829 A | 12/2006 |
| --- | --- | --- |
| JP | 2001-351997 A | 12/2001 |
| JP | 2004-311593 A | 11/2004 |
| JP | 2005-311288 A | 11/2005 |
| JP | 2007-019498 A | 1/2007 |
| WO | 2005/093826 A1 | 10/2005 |

OTHER PUBLICATIONS

Chinese Office Action dated Jul. 30, 2010, corresponding to Chinese Application No. 2007-80036182.6.

* cited by examiner

FIG.7

| | ADHESIVE A | | ADHESIVE B | |
|---|---|---|---|---|
| Tg: GLASS TRANSITION TEMPERATURE | 65°C | | 105°C | |
| IMPURITY ION CONCENTRATION | 450ppm | | 30ppm | |
| OPERATING TEMPERATURE | NORMAL TEMPERATURE (30°C) | HIGH TEMPERATURE (85°C) | NORMAL TEMPERATURE (30°C) | HIGH TEMPERATURE (85°C) |
| DIELECTRIC CONSTANT | 4.0 | 6.0 | 4.0 | 4.0 |
| LEAKAGE CURRENT | 0μA | 10~60μA | 0μA | 0~5μA |

SOLID-STATE IMAGE SENSOR

CROSS REFERENCE TO RELATED APPLICATIONS

This application is a National Stage of International Application No. PCT/JP2007/069399 filed Sep. 27, 2007, claiming priority based on Japanese Patent Application Nos. 2006-265497 and 2006-265498, both filed on Sep. 28, 2006, the contents of all of which are incorporated herein by reference in their entirety.

TECHNICAL FIELD

The present invention relates to a solid-state image sensor in which a wafer formed with imaging devices thereon is covered with a transparent protection member attached to the wafer through a spacer surrounding the imaging devices.

BACKGROUND ART

In recent years, there have been requests for further miniaturization of solid-state image sensors composed of CCD (charge-coupled devices) or CMOS (complementary metal oxide semiconductor) sensors, used in digital cameras and mobile telephones.

In order to meet such requests to miniaturize solid-state image sensors, there are proposed solid-state image sensors and manufacturing methods thereof, in which the solid-state image sensors are manufactured by attaching a transparent protection member to an imaging device wafer, on which many light-receiving parts of imaging devices have been formed, through spacers formed in positions separately surrounding the light-receiving parts, and thereafter separating the joined substrate into individual solid-state image sensors (see Japanese Patent Application Laid-Open No. 2001-351997, for example).

An example of the above-mentioned solid-state image sensor is described with reference to FIGS. 1 and 2, which are a perspective view illustrating an external configuration of a solid-state image sensor 1 and a cross-sectional view thereof. The solid-state image sensor 1 is constituted of: an imaging device chip 2 manufactured by cutting an imaging device wafer on which imaging devices 3 have been formed; a frame-shaped spacer 5 attached on the imaging device chip 2 and surrounding the imaging devices 3; and an optically-transplant protection member 4 attached to the spacer 5 to seal the imaging devices 3.

As shown in FIG. 2, the imaging device chip 2 includes: a rectangular chip substrate 2A; the imaging devices 3 formed on the chip substrate 2A; and pads or electrodes 6, which are arranged around the imaging devices 3 and to be wired with the external. The chip substrate 2A is made of monocrystalline silicon, for example, and has the thickness of about 300 µm, for example.

The protection member 4 is made of optically-transplant material such as resin and glass of heat-resistant and chemical-resistant, for example, and has the thickness of about 500 µm, for example.

It is preferable that the spacer 5 is made of material having the properties, such as the thermal expansion coefficient, similar to those of the chip substrate 2A and the protection member 4, and the spacer 5 is made of polycrystalline silicon, for example. A part of the frame-shaped spacer 5 has a cross-section about 200 µm in width and about 100 µm in thickness, for example. An end face 5A of the spacer 5 is joined to the chip substrate 2A with an adhesive 7, and the other end face of the spacer 5 is joined to the protection member 4 with an adhesive 8.

DISCLOSURE OF THE INVENTION

The above-described solid-state image sensor 1 is provided with an electrostatic discharge (ESD) protection circuit (see FIG. 8) between each of the internal circuits including the imaging devices 3 and the corresponding pad 6, in order to protect the internal circuits against ESD stress generated in the pads 6.

FIG. 3 is a cross-sectional view illustrating an ESD protection device 10 serving as the ESD protection circuit of the solid-state image sensor. In the ESD protection device 10, layers of n-type semiconductor serving as diffusion layers 12 and 13 are separately formed on a well layer of p-type semiconductor 11 formed on a substrate of n-type semiconductor, and the diffusion layer 13 is connected to the internal circuit and the pad 6 through a wire 15, and the diffusion layer 12 is grounded through a ground wire 16 having a voltage lower than a voltage applied to the internal circuit.

An insulating layer 14 made of silica ($SiO_2$) is formed between the diffusion layers 12 and 13 on the p-well layer 11, over which a BPSG (borophosphosilicate glass) layer 19 serving as an interlayer insulating layer, an SiN (silicon nitride) layer 17 constituting intralayer lenses and the like, and a CCD cover layer 18 made of resin, are formed. Since the ESD protection device 10 is positioned under the spacer 5, then there is the adhesive 7, with which the spacer 5 is joined to the chip substrate 2A, over the ESD protection device 10.

When the solid-state image sensor 1 is used for long duration while the whole solid-state image sensor 1 generates heat, it is possible that the resin material of the adhesive 7 and the like have high temperature. In the adhesive 7 of high temperature, cross-linking between the polymer molecules becomes loose, and polarization is more likely to arise due to movement of movable ions and orientation of the molecules and electrons in the molecules.

When polarization arises in the adhesive 7 as illustrated in FIG. 4, an electric field 23 is produced by the electric charges 22 in the adhesive 7 and the element interface, and since the p-well layer 11 between the diffusion layers 13 and 12 of the ESD protection device 10 has low impurity concentration, the p-well layer 11 is inverted and a parasitic MOS transistor is thereby turned on, and thus leakage current 24 flows into the ground wire 16.

The leakage current 24 in the ESD protection device 10 may cause occurrence of noises and operational troubles in the solid-state image sensor 1.

The present invention has been achieved to address the above-described problem, and an object thereof is to provide a solid-state image sensor in which parasitic MOS transistors are prevented from being produced and no leakage current flows in ESD protection circuits in the solid-state image sensor.

In order to attain the aforementioned object, the present invention is directed to a solid-state image sensor, comprising: an imaging device wafer; a plurality of imaging devices which are formed on the imaging device wafer; a spacer which surrounds the imaging devices on the imaging device wafer and is joined to the imaging device wafer with an adhesive; a transparent protection member which covers the imaging devices on the imaging device wafer and is attached on the spacer; and a plurality of electrostatic discharge protection devices which are formed on the imaging device wafer, the electrostatic discharge protection devices being positioned under the spacer, each of the electrostatic discharge protection devices having diffusion layers and a well layer between the diffusion layers, the well layer being provided with a channel stopper.

According to this aspect of the present invention, the channel stopper having a high impurity concentration is formed in the well layer between the diffusion layers of the ESD protection device. Accordingly, the well layer is hardly inverted, the parasitic MOS transistor is hardly turned on, and thus the leakage current can be controlled.

In order to attain the aforementioned object, the present invention is also directed to a solid-state image sensor, comprising: an imaging device wafer; a plurality of imaging devices which are formed on the imaging device wafer; a spacer which surrounds the imaging devices on the imaging device wafer and is joined to the imaging device wafer with an adhesive; a transparent protection member which covers the imaging devices on the imaging device wafer and is attached on the spacer; a plurality of electrostatic discharge protection devices which are formed on the imaging device wafer, the electrostatic discharge protection devices being positioned under the spacer, each of the electrostatic discharge protection devices having diffusion layers and a well layer between the diffusion layers; and a silicon nitride layer which is formed on the imaging device wafer between the well layer and the spacer and has a thickness of 0.4 μm through 1.5 μm.

According to this aspect of the present invention, the thickness of the silicon nitride layer being typically 0.2 μm is increased to 0.4 μm through 1.5 μm, and thus the distance from the interface with the adhesive to the well layer lying between the diffusion layers is increased, weakening the electric field that may cause the inversion in the well layer. Accordingly, the well layer is not inverted and the parasitic MOS transistor is not turned on, so that no leakage current flows.

In order to attain the aforementioned object, the present invention is also directed to a solid-state image sensor, comprising: an imaging device wafer; a plurality of imaging devices which are formed on the imaging device wafer; a spacer which surrounds the imaging devices on the imaging device wafer and is joined to the imaging device wafer with an adhesive having a glass transition temperature higher than an operating temperature of the solid-state image sensor; and a transparent protection member which covers the imaging devices on the imaging device wafer and is attached on the spacer.

According to this aspect of the present invention, as the adhesive for joining the spacer to the imaging device wafer, there is used the adhesive having the glass transition temperature higher than the operating temperature of the solid-state image sensor. The glass transition temperature is a temperature at which, when heated, a polymer material such as the adhesive changes from a solid or glassy state to a rubbery state.

Even when the temperature of the adhesive is raised by heating of the solid-state image sensor, since the glass transition temperature of the adhesive is higher than the operating temperature of the solid-state image sensor, then movement of impurity ions and the like, increase of the dielectric constant, and molecule orientation or the like, caused by loosening of the cross-linking of the adhesive, hardly occur and thus the polarization of the adhesive does not occur. Consequently, the well layer is hardly inverted, the parasitic MOS transistor is hardly turned on, and thus the leakage current can be controlled.

It is preferable that the glass transition temperature of the adhesive is between 50° C. through 160° C., more preferably 80° C. through 160° C.

According to this aspect of the present invention, the glass transition temperature of the adhesive is higher than the operating temperature of the solid-state image sensor, so that the cross-linking of the adhesive hardly loosens and the polarization of the adhesive hardly occurs.

It is also preferable that the adhesive has a dielectric constant of 2.0 through 6.0, more preferably 2.0 through 4.5.

According to this aspect of the present invention, charging in the adhesive hardly occurs and the polarization of the adhesive hardly occurs.

It is also preferable that the adhesive has an impurity ion concentration of 10 ppm through 500 ppm, more preferably 10 ppm through 200 ppm, even more preferably 10 ppm through 100 ppm.

According to this aspect of the present invention, since the concentration of impurity ions such as sodium ions and chloride ions mixed in the adhesive during the manufacturing process is low, then the movement of the impurity ions that causes polarization of the adhesive hardly occurs.

Hence, the well layer is hardly inverted, and the parasitic MOS transistor is hardly turned on, and thus the leakage current can be controlled.

As described above, according to the solid-state image sensor of the present invention, parasitic MOS transistors can be prevented from being produced, and leakage current can be prevented from flowing in the ESD protection circuits in the solid-state image sensor.

BRIEF DESCRIPTION OF THE DRAWINGS

FIG. 7 is a table in which leakage current in a solid-state image sensor according to a third embodiment is compared with that of a solid-state image sensor not based on the present invention.

LIST OF REFERENCE NUMERALS

1: solid-state image sensor; 2: imaging device chip; 2A: chip substrate; 3: imaging device; 4: transparent protection member; 5: spacer; 5A: end face; 6: pad; 7: adhesive; 10, 10A, 10B: ESD protection device; 11: p-well layer; 12, 13: diffusion layer; 14: insulating layer; 15: wire; 16: ground wire; 17, 17A: SiN layer; 18: CCD cover layer; 19: BPSG layer; 20: channel stopper; 22: electric charge; 23: electric field; 24: leakage current

BEST MODES FOR CARRYING OUT THE INVENTION

Solid-state image sensors according to preferred embodiments of the present invention are described in detail with reference to the accompanying drawings.

First, a configuration of a solid-state image sensor including an ESD protection circuit concerning the present invention is described.

Figure 1:
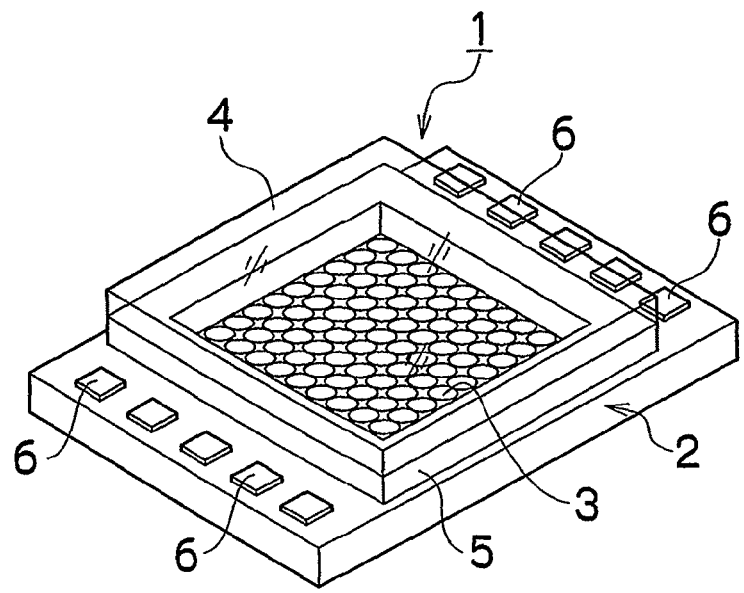
FIG. 1 is a perspective view illustrating an external configuration of a solid-state image sensor.

The solid-state image sensor 1 illustrated in FIG. 1 is constituted of: an imaging device chip 2, on which imaging devices 3 are arranged; a frame-shaped spacer 5 attached on the imaging device chip 2 and surrounding the imaging devices 3; and an optically-transplant protection member 4 mounted on the spacer 5 to seal the imaging devices 3.

Figure 2:
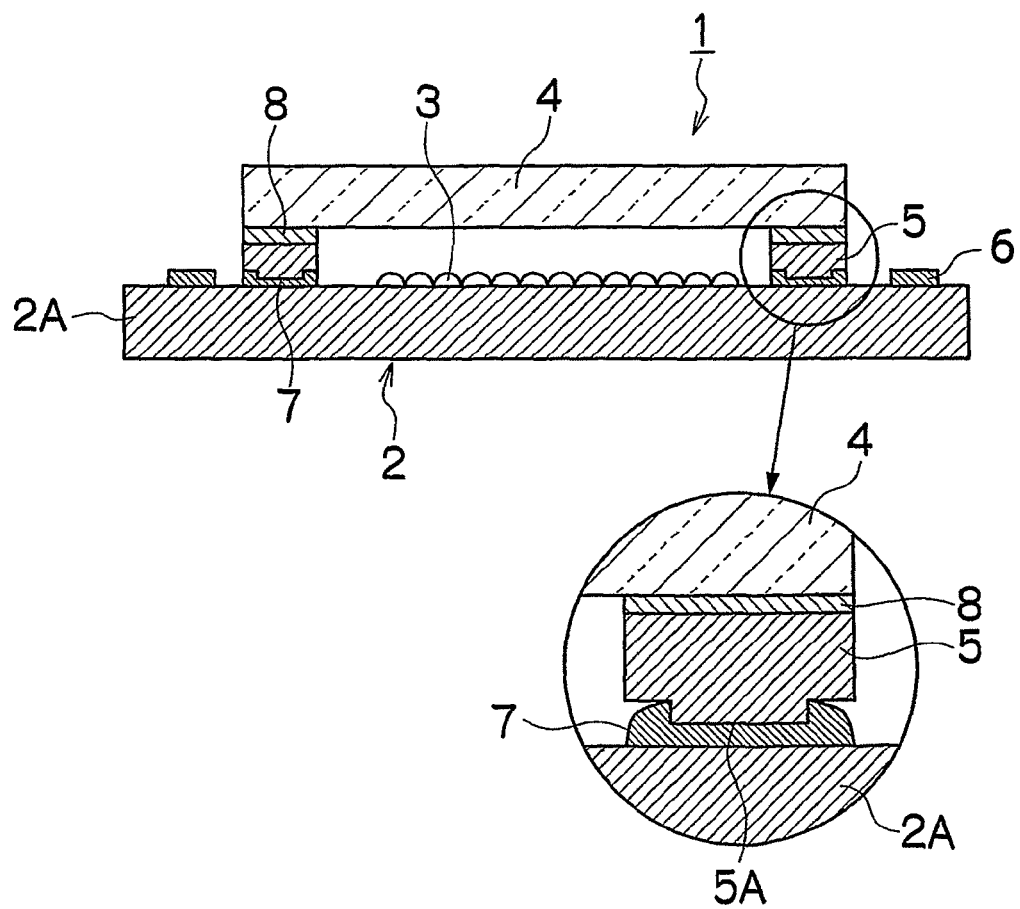
FIG. 2 is a cross-sectional view illustrating essential parts of the solid-state image sensor.

As shown in FIG. 2, the imaging device chip 2 includes: a rectangular chip substrate 2A; the imaging devices 3 formed on the chip substrate 2A; and pads 6 to be wired with the external. The chip substrate 2A is made of monocrystalline silicon, for example, and has the thickness of about 300 μm, for example.

The protection member 4 is made of optically-transplant material such as resin and glass of heat-resistant and chemical-resistant, for example, and has the thickness of about 500 μm, for example.

It is preferable that the spacer 5 is made of material having the properties, such as the thermal expansion coefficient, similar to those of the chip substrate 2A and the protection member 4, and the spacer 5 is made of polycrystalline silicon, for example. A part of the frame-shaped spacer 5 has a cross-section about 200 μm in width and about 100 μm in thickness, for example. An end face 5A of the spacer 5 is joined to the chip substrate 2A with an adhesive 7, and the other end face of the spacer 5 is joined to the protection member 4 with an adhesive 8.

The solid-state image sensor 1 is provided with an ESD protection device 10 (see FIG. 3) between each of the internal circuits including the imaging devices 3 and the corresponding pad 6.

In the ESD protection device 10, n-layers serving as diffusion layers 12 and 13 are separately formed on a p-well layer 11, and the diffusion layer 13 is connected to the internal circuit and the pad 6 through a wire 15, and the diffusion layer 12 is grounded through a ground wire 16 having a voltage lower than a voltage applied to the internal circuit.

An insulating layer 14 made of silica is formed between the diffusion layers 12 and 13 on the p-well layer 11, over which a BPSG layer 19 serving as an interlayer insulating layer, an SiN layer 17 constituting intralayer lenses and the like, and a CCD cover layer 18 made of resin, are formed. Since the ESD protection device 10 is disposed under the spacer 5, then there is the adhesive 7, with which the spacer 5 is joined to the chip substrate 2A, over the ESD protection device 10.

Figure 5:
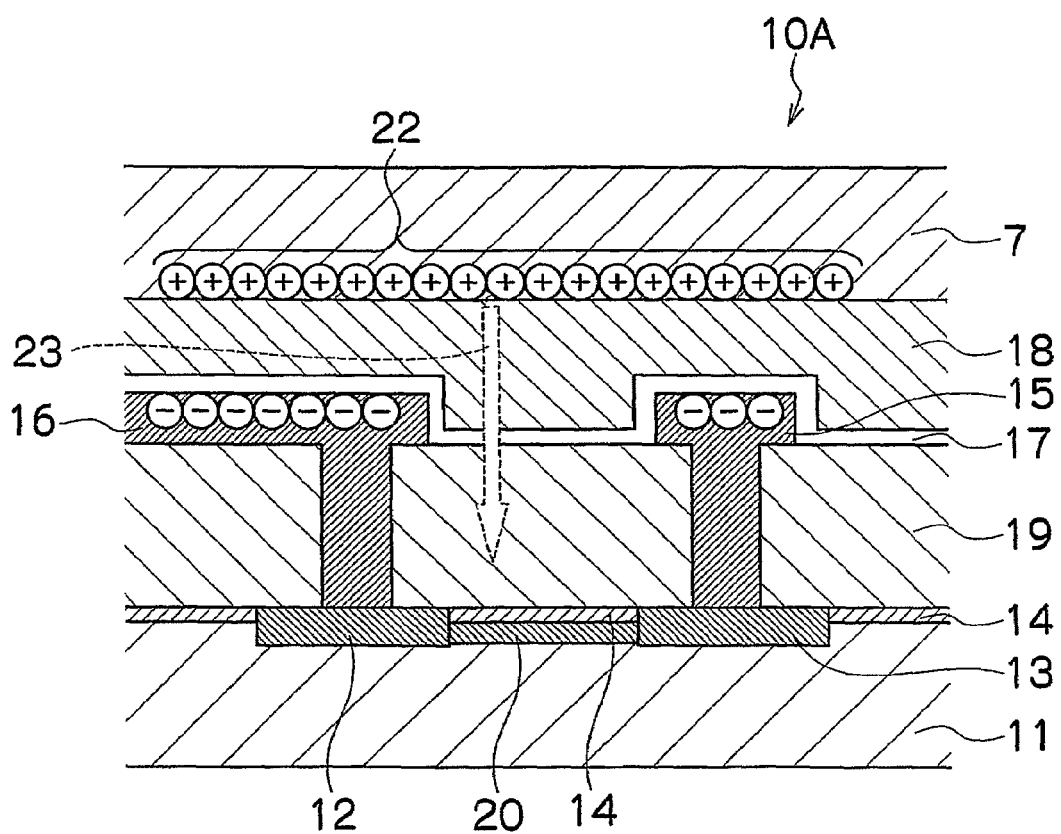
FIG. 5 is a cross-sectional view illustrating essential parts of a solid-state image sensor according to a first embodiment of the present invention.

A solid-state image sensor according to a first embodiment of the present invention is described. FIG. 5 is a cross-sectional view illustrating a configuration of an ESD protection device 10A according to the first embodiment.

In the ESD protection device 10A, similarly to the ESD protection device 10, n-layers serving as diffusion layers 12 and 13 are separately formed on a p-well layer 11, and the diffusion layer 13 is connected to the internal circuit and the pad 6 through a wire 15, and the diffusion layer 12 is grounded through a ground wire 16 having a voltage lower than a voltage applied to the internal circuit.

An insulating layer 14 made of silica is formed between the diffusion layers 12 and 13 on the p-well layer 11, over which a BPSG layer 19 serving as an interlayer insulating layer, an SiN layer 17 constituting intralayer lenses and the like, and a CCD cover layer 18 made of resin, are formed. Moreover, there is an adhesive 7 over the CCD cover layer 18.

A channel stopper 20 is arranged between the diffusion layers 13 and 12 on the p-well layer 11. The channel stopper 20 has an impurity concentration higher than that of the p-well layer 11.

The channel stopper 20 is formed by implanting ions such as boron (B) into a part corresponding to a depth of 0 through 1.5 μm from the surface (over which the BPSG layer 19 etc. are arranged) of the p-well layer 11.

For example, the implanted ion concentration in the channel stopper 20 is about $7.0 \times 10^{12}$ (ions/cm$^2$), while the ion concentration in the p-well layer 11 is $2.3 \times 10^{11}$ (ions/cm$^2$). It is preferable that the ion concentration in the channel stopper 20 is about 30-times relative to the ion concentration in the p-well layer 11.

Accordingly, no parasitic MOS transistor is turned on since the p-well layer 11 is not inverted, and hence no leakage current flows in the ESD protection device 10A.

Figure 6:
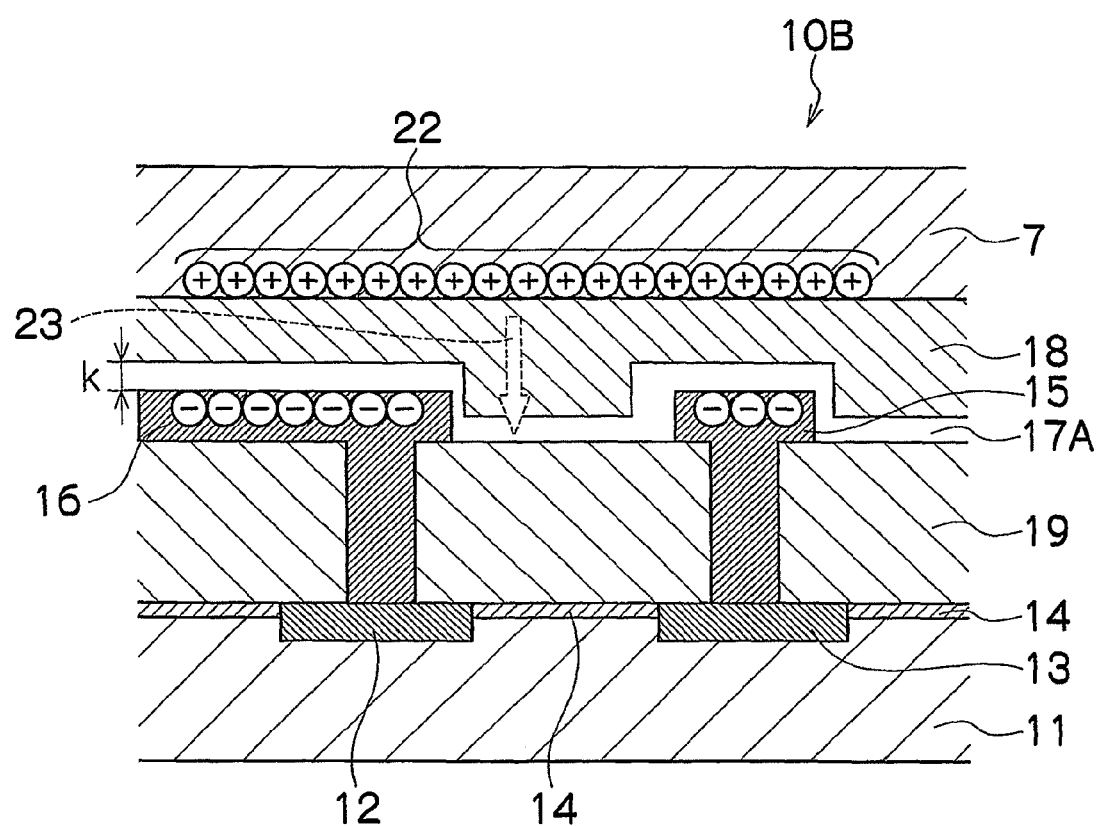
FIG. 6 is a cross-sectional view illustrating essential parts of a solid-state image sensor according to a second embodiment of the present invention.
Figure 8:
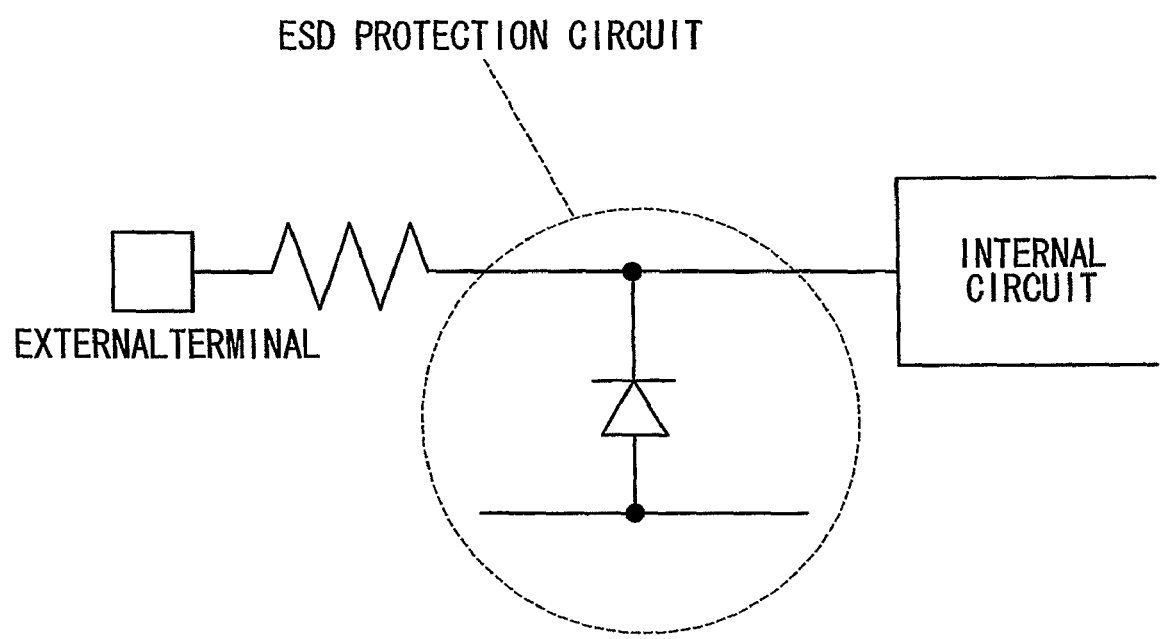
FIG. 8 is a circuit diagram illustrating an exemplary configuration of an electrostatic protection circuit.

A solid-state image sensor according to a second embodiment of the present invention is described. FIG. 6 is a cross-sectional view illustrating a configuration of an ESD protection device 10B according to the second embodiment.

In the second embodiment, the same reference numerals are applied to parts identical to or similar to those of the first embodiment, and explanation thereof is omitted here.

In the ESD protection device 10B, similarly to the ESD protection device 10, n-layers serving as diffusion layers 12 and 13 are separately formed on a p-well layer 11, and the diffusion layer 13 is connected to the internal circuit and the pad 6 through a wire 15, and the diffusion layer 12 is grounded through a ground wire 16 having a voltage lower than a voltage applied to the internal circuit.

An insulating layer 14 made of silica is formed between the diffusion layers 12 and 13 on the p-well layer 11, over which a BPSG layer 19 serving as an interlayer insulating layer, an SiN layer 17A constituting intralayer lenses and the like, and a CCD cover layer 18 made of resin, are formed. Moreover, there is an adhesive 7 over the CCD cover layer 18.

Figure 3:
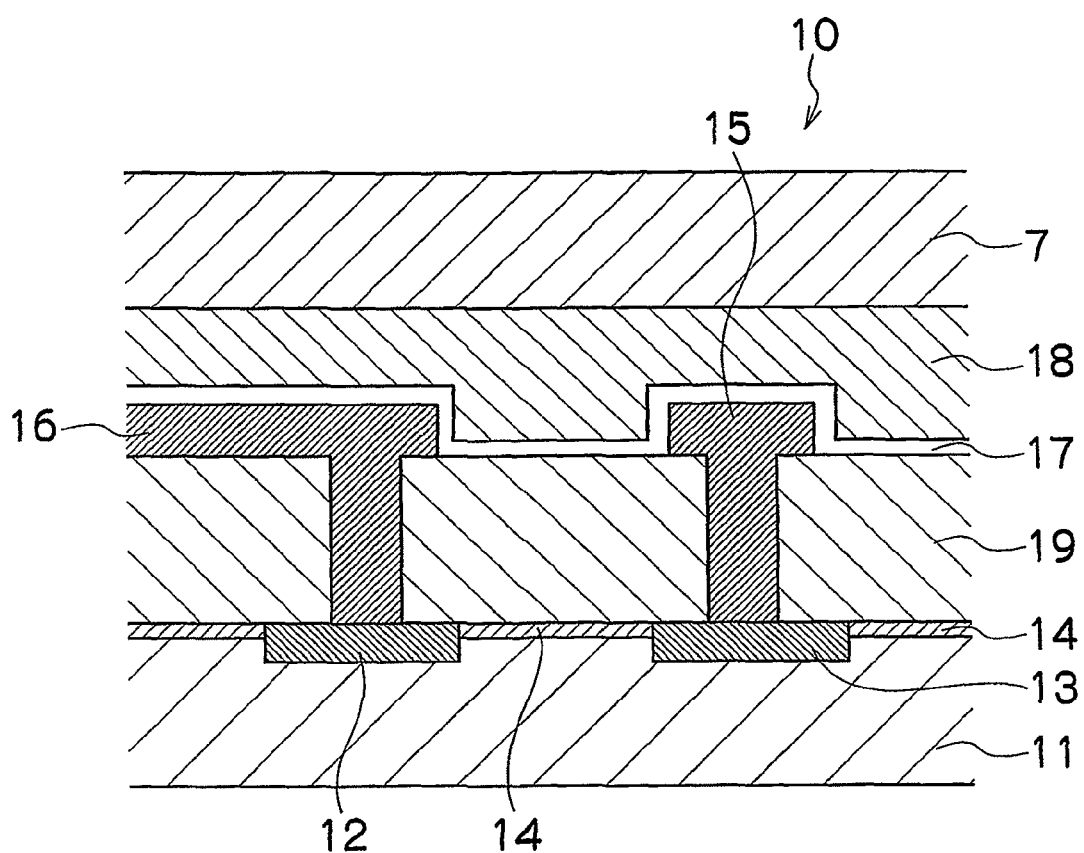
FIG. 3 is a cross-sectional view illustrating a configuration of an electrostatic protection device.
Figure 4:
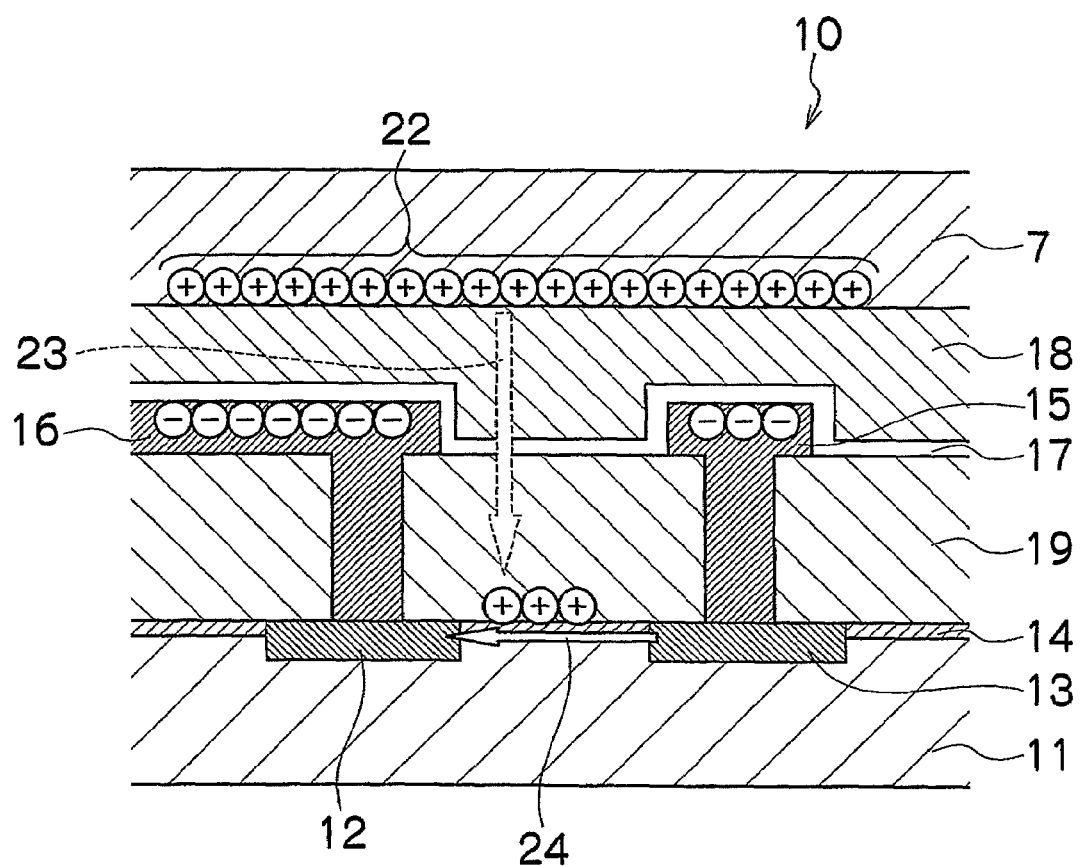
FIG. 4 is a cross-sectional view illustrating the cause of leakage current.

The thickness k of the SiN film 17A is 0.4 μm through 1.5 μm in the present embodiment, while the thickness of the SiN film 17 illustrated in FIG. 3 is 0.2 μm.

Accordingly, the electric field that causes inversion of the p-well layer 11 is weakened by the SiN film 17A. Therefore, the p-well layer 11 is hardly inverted, the parasitic MOS transistor is then hardly turned on, and hence leakage current can be controlled.

A solid-state image sensor according to a third embodiment of the present invention is described.

In the third embodiment, as the adhesive 7 illustrated in FIG. 3, there is used an adhesive having a glass transition temperature (e.g., 105° C.) higher than the operating temperature (e.g., 85° C.) of the solid-state image sensor 1, a low concentration of impurity ions such as sodium ions and chloride ions mixed during the manufacturing process, etc., and a low dielectric constant.

More specifically, as the adhesive 7 illustrated in FIG. 3, there is used an adhesive having a glass transition temperature of 50° C. through 160° C., more preferably 80° C. through 160° C.; a dielectric constant of 2.0 through 6.0, more preferably 2.0 through 4.5; and an impurity ion concentration of 10 ppm through 500 ppm, more preferably 10 ppm through 200 ppm, even more preferably 10 ppm through 100 ppm.

Accordingly, since the glass transition temperature of the adhesive 7 is higher than the operating temperature of the solid-state image sensor 1, the cross-linking between the polymer molecules in the adhesive 7 hardly loosens, and the movement of impurity ions etc. and the molecule orientation that cause polarization hardly occur in the adhesive 7.

Moreover, since the impurity ion concentration of the adhesive 7 is low, even when the adhesive 7 becomes high in temperature, the movement of the impurity ions that causes polarization hardly occurs. Furthermore, since the adhesive 7 is low in the dielectric constant, charging hardly occurs. Due to these, the polarization of the adhesive 7 hardly occurs.

Consequently, the p-well layer 11 is hardly inverted, the parasitic MOS transistor is hardly turned on, and hence leakage current can be controlled.

Implementation Examples

Implementation examples of the solid-state image sensors according to the present invention are described.

First, with respect to the leakage current, a solid-state image sensor manufactured according to the first embodiment of the present invention is compared to a solid-state image sensor of a comparative example not based on the present invention.

In the solid-state image sensor according to the first embodiment, the channel stopper 20 was formed by implanting boron ions at $7.0 \times 10^{12}$ (ions/cm$^2$), and the ion concentration in the p-well layer 11 was $2.3 \times 10^{11}$ (ions/cm$^2$).

As a result, the leakage current of about 10 μA through 60 μA flowed in the solid-state image sensor of the comparative example having no channel stopper. In contrast, the leakage current did not flow at all in the solid-state image sensor according to the first embodiment, and thus the effects of the present invention were verified.

Next, with respect to the leakage current, a solid-state image sensor manufactured according to the second embodiment of the present invention is compared to a solid-state image sensor of a comparative example not based on the present invention.

The SiN layer of the solid-state image sensor according to the second embodiment was 0.44 μm in thickness, and the SiN layer of the solid-state image sensor of the comparative example was 0.22 μm in thickness.

As a result, the leakage current of about 10 μA through 60 μA flowed in the solid-state image sensor of the comparative example. In contrast, the leakage current of as small as 0 μA through 5 μA flowed in the solid-state image sensor according to the second embodiment, and thus the effects of the present invention were verified.

Next, with respect to the leakage current, a solid-state image sensor manufactured according to the third embodiment of the present invention is compared to a solid-state image sensor of a comparative example not based on the present invention. FIG. 7 is a table in which the leakage current in the solid-state image sensors manufactured according to the third embodiment is compared with that of the solid-state image sensor of the comparative example.

In the solid-state image sensor of the comparative example, an adhesive A in FIG. 7 was used to join the imaging device chip 2 and the spacer 5 illustrated in FIG. 1. In the solid-state image sensor according to the third embodiment, an adhesive B in FIG. 7 was used to join the imaging device chip 2 and the spacer 5.

As shown in FIG. 7, the adhesive A has the glass transition temperature (65° C.) lower than the operating temperature (85° C.) of the solid-state image sensor, and has a high impurity ion concentration (450 ppm). The adhesive agent B has the glass transition temperature (105° C.) higher than the operating temperature (85° C.) of the solid-state image sensor, and has a low impurity ion concentration (30 ppm).

As a result, the leakage current of about 10 μA through 60 μA flowed in the solid-state image sensor of the comparative example at the high temperature. In contrast, the leakage current of as small as 0 μA through 5 μA flowed in the solid-state image sensor according to the third embodiment even at the high temperature, and thus the effects of the present invention were verified.

As described above, according to the solid-state image sensor of the present invention, it is possible that the p-well layers are prevented from being inverted, no parasitic MOS transistors are produced, and the leakage current is thus prevented from flowing in the ESD protection circuits in the solid-state image sensor.

The invention claimed is:

1. A solid-state image sensor, comprising:
an imaging device wafer;
a plurality of imaging devices which are formed on the imaging device wafer;
a spacer which surrounds the imaging devices on the imaging device wafer and is joined to the imaging device wafer with an adhesive;
a transparent protection member which covers the imaging devices on the imaging device wafer and is attached on the spacer; and
a plurality of electrostatic discharge protection devices which are formed on the imaging device wafer, the electrostatic discharge protection devices being positioned under the spacer, each of the electrostatic discharge protection devices having diffusion layers and a well layer between the diffusion layers, the well layer being provided with a channel stopper.

2. A solid-state image sensor, comprising:
an imaging device wafer;
a plurality of imaging devices which are formed on the imaging device wafer;
a spacer which surrounds the imaging devices on the imaging device wafer and is joined to the imaging device wafer with an adhesive;
a transparent protection member which covers the imaging devices on the imaging device wafer and is attached on the spacer;
a plurality of electrostatic discharge protection devices which are formed on the imaging device wafer, the electrostatic discharge protection devices being positioned under the spacer, each of the electrostatic discharge protection devices having diffusion layers and a well layer between the diffusion layers; and
a silicon nitride layer which is formed on the imaging device wafer between the well layer and the spacer and has a thickness of 0.4 μm through 1.5 μm.

* * * * *